United States Patent [19]

Dalpee et al.

[11] 4,040,119

[45] Aug. 2, 1977

[54] PROGRAMMER FOR MAGNETIC LATCHING RELAYS

[75] Inventors: Joseph A. Dalpee, New Carrollton, Md.; Fred W. Bernard, Alexandria, Va.; Richard G. Reynolds, Bowie, Md.

[73] Assignee: The United States of America as represented by the Secretary of the Navy, Washington, D.C.

[21] Appl. No.: 706,409

[22] Filed: July 19, 1976

[51] Int. Cl.² ............................................. H01H 47/32
[52] U.S. Cl. .................................................... 361/191
[58] Field of Search .................. 328/58, 55, 129–131; 307/239, 241, 246, 262; 361/166, 171, 186, 191

[56] References Cited

U.S. PATENT DOCUMENTS

| | | | |
|---|---|---|---|
| 3,586,983 | 6/1971 | Marsh, Jr. | 361/191 |
| 3,670,209 | 6/1972 | Hensen | 361/191 |
| 3,817,582 | 6/1974 | Green et al. | 328/55 |
| 3,821,653 | 6/1974 | Fretwell | 307/262 |
| 3,874,255 | 1/1975 | Minam | 361/161 |
| 3,931,550 | 1/1976 | Dalpee | 361/186 |

*Primary Examiner*—Gerald Goldberg
*Attorney, Agent, or Firm*—R. S. Sciascia; Philip Schneider; William C. Daubenspeck

[57] ABSTRACT

The output of a first monostable multivibrator controls output-driving devices to provide an operating current and voltage to latch each magnetic latching relay in a first position. The first multivibrator then triggers a second monostable multivibrator whose output in conjunction with logic means controls output-driving devices to provide an operating current and voltage to latch selected relays in a second position.

3 Claims, 1 Drawing Figure

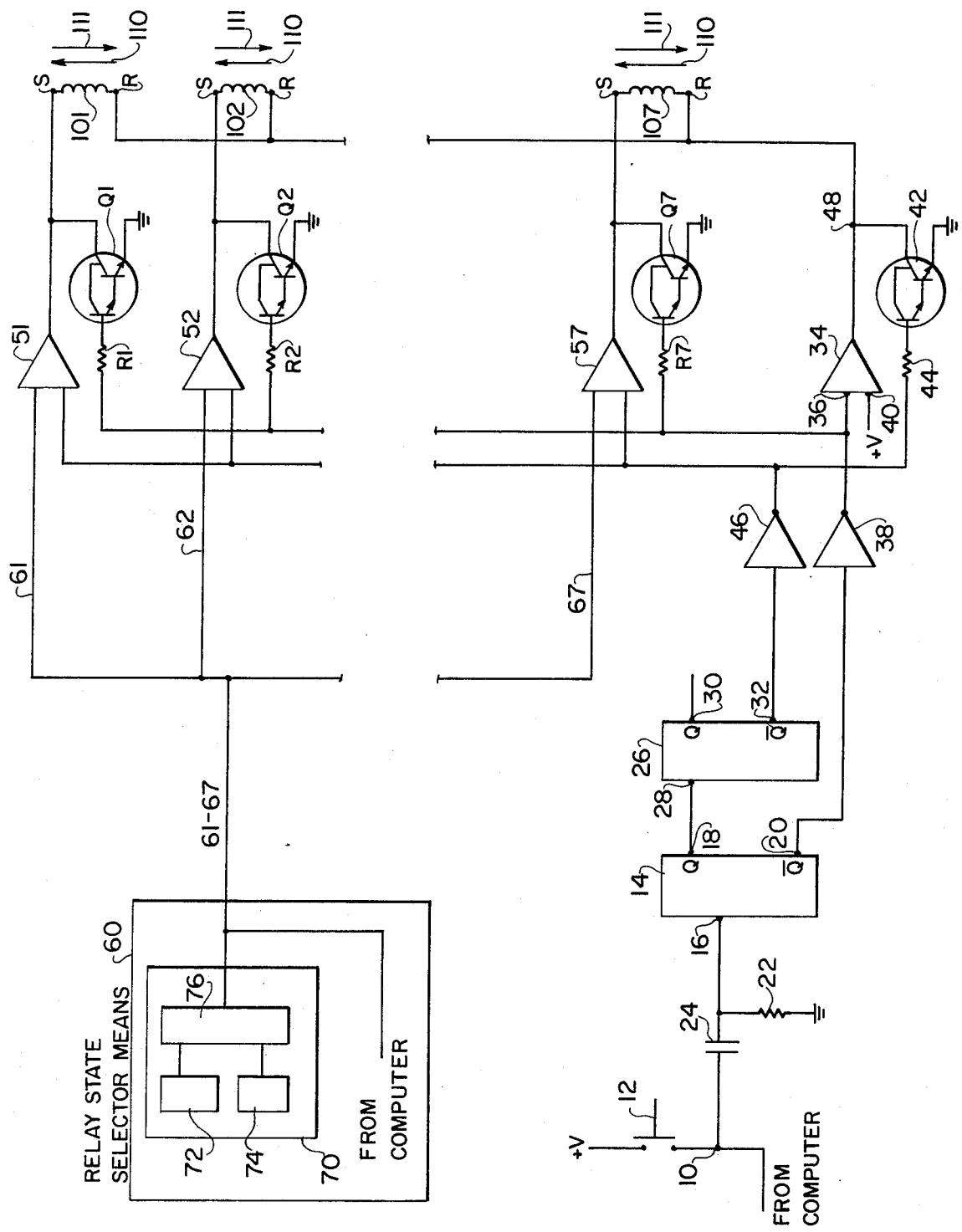

4,040,119

PROGRAMMER FOR MAGNETIC LATCHING RELAYS

BACKGROUND OF THE INVENTION

The present invention relates in general to switching apparatus and more particularly to switching circuits for controlling magnetic latching relays. More specifically, the present invention relates to a circuit particularly useful for controlling magnetic latching relays in programmable attenuators.

Previous switching methods for controlling magnetic latching relays in programmable attenuators have generally utilized a polarity-reversing device such as a double-pole double-throw relay or toggle switch connected in a polarity-reversing mode. Although, in general, these methods were satisfactory, they resulted in an energizing current being applied to the relay coil continuously even through the energizing current was not needed once a relay had been latched. In cases where toggle switches were used, the relay settings (and consequently the attenuation) could not be changed quickly since each relay was controlled by a separate toggle switch.

SUMMARY OF THE INVENTION

The present invention is a programmer for selectively controlling magnetic latching relays that overcomes the disadvantages of the prior switching methods. In response to a control signal, a first monostable multivibrator enables output- driving devices that provide an operating voltage and current to latch each relay in a first position. The first monostable multivibrator then triggers a second monostable multivibrator which operates in conjunction with logic means to enable output-driving devices that provide an operating voltage and current to latch selected relays in a second position. The operating current and voltage are present only when the multivibrators are in the quasi-stable state.

An object of the present invention is to provide for selectively controlling magnetic latching relays.

Another object of the present invention is to provide for control of magnetic latching relays in which the operating current and voltage is terminated once the relay is latched.

A further object of the present invention is to provide for rapid and efficient control of magnetic latching relays utilized in programmable attenuators.

Other objects and many attendant advantages of this invention will be readily appreciated as the same becomes better understood by reference to the following detailed description when considered in conjunction with the accompanying drawing wherein:

BRIEF DESCRIPTION OF THE DRAWING

The single FIGURE is a functional schematic diagram of an embodiment of the present invention.

DESCRIPTION OF THE PREFERRED EMBODIMENT

Referring now to the FIGURE, the programmer according to the present invention has an input terminal 10 for receiving an activating signal. The activating signal may be supplied by a momentary contact switch 12 connected between the input terminal 10 and a positive voltage source or by a control signal from a computer (not shown).

A first monostable multivibrator 14, having an input terminal 16 and first and second output terminals 18 and 20 for signals Q and $\bar{Q}$, respectively, receives the activating signal via a differentiating network comprising a resistor 22 and a capacitor 24. A second monostable multivibrator 26 has an input terminal 28 connected to the first output terminal 18 of the first monostable multivibrator 14 and first and second output terminals 30 and 32 for signals Q and $\bar{Q}$, respectively.

A first AND-drive device 34 (which is a combination of an AND device and an amplifier) has a first input terminal 36 connected to the second output terminal 20 of first monostable multivibrator 14 through a first inverting amplifier 38. A second input terminal 40 of first AND-driver device 34 is connected to a positive voltage source.

A first output-driving transistor 42 has its base connected through a resistor 44 to the output of a second inverting amplifier 46 that has its input connected to the second output terminal 32 of second monostable multivibrator 26. The collector of first output-driving transistor 42 is connected to an output terminal 48 of the first AND-driver device 34, while the emitter of transistor 42 is connected to ground.

The present embodiment is adapted to receive the coils of seven magnetic latching relays 101–107. Each relay has a reset terminal R and a set terminal S adapted to receive the coil-activating voltage and current. Output terminal 48 of the first AND-driver device 34, in addition to being connected to the collector of first output-driving transistor 42, is also connected to the reset terminal R of each relay 101–107. The set terminal S of each relay 101-14 107 is connected to an associated AND-driver device and an associated output-driving transistor.

Considering, now, relay 101 and the AND-driver device and output-driving transistor associated with it, the set terminal S of relay 101 is connected to the output of AND-driver device 51 and to the collector of an output-driving transistor Q1. Transistor Q1 has its emitter connected to ground and has its base connected through a resistor R1 to the output of the first inverting amplifier 38. The AND-driver device 51 has a first input connected to the output of the second inverting amplifier 46 and a second input connected to relay state-selector means 60 via line 61.

In a similar manner, the set terminal S of relay 102 is connected to the output of an AND-driver device 52 and to the collector of an output-driving transistor Q2. Transistor Q2 has its emitter connected to ground and has its base connected through resistor R2 to the output of the first inverting amplifier 38. The AND-driver device 52 has a first input connected to the output of the second inverting amplifier 46 and a second input connected to relay state-selector means 60 via line 62.

The five remaining relays 103–107 and the associated AND-driver devices and output-driving transistors are connected in the same manner as described hereinbefore in connection with relays 101 and 102. That is, the set terminals S of relays 103, 104, 105, 106, and 107 are connected to the output of AND-driver devices 53, 54, 55, 56, and 57, respectively, and to the collector of output driving transistors Q3, Q4, Q5, Q6, and Q7, respectively. Each transistor Q3–Q7 has its emitter connected to ground and its base connected through a resistor R3–R7 to the output of the first inverting amplifier 38. The AND-driver devices 53–57 have a first input connected to the second inverting amplifier 46 and second input connected via lines 63-67 respectively to relay state-selector means 60.

The relay state-selector means 60 provides control signals for input to the AND-driver devices associated with relays 101-107 and may be a computer or other device capable of producing signals appropriate for input to the AND-driver devices.

Block 70 illustrates an optional relay state-selector means which is adapted to provide signals to control the magnetic latching relays of a programmable attenuator, such as Hewlett Packard Models 33300 and 33301. Block 70 comprises two thumb- wheel switches 72 and 74 having BCD outputs connected to a logic means 76 to convert the BCD outputs of the switches to the 1-2-4-4 code utilized by the attenuators. The outputs of logic means 76 are connected to the first input of the appropriate AND- driver devices 51-57 via lines 61-67.

All elements used in the embodiment of the present invention may be conventional integrated circuits. For example, monostable multivibrators 14 and 26 may be a type MC9601, while the inverting amplifiers 38 and 46 may be a type SN 7404. Integrated circuit type NH-0005-CN is suitable for use as an AND-driver device, while Darlington transistor 2N6037 is suitable for use as an output-driving transistor.

In operation, an activating pulse (typically 5 volts) is received at input terminal 10. The positive-going transition of the leading pulse edge is passed through capacitor 22 (which acts to the block the dc component of the control pulse) of the differentiating network causing monostable multivibrator 14 to produce complementary output pulses Q and $\bar{Q}$ of fixed duration. The duration of these pulses is adjustable to allow for varying characteristics of relay control coils that are to be used in conjunction with the present invention. In the embodiment of the present invention, the duration of the output pulse is typically chosen to be 50 milliseconds. The associated latching relays 100-107 are typically actuated in the voltage range of from 6 to 60 volts dc and with an actuation current to 3 amps.

The activating signal causes the first multivibrator 14 to produce a negative-going pulse at the normally high $\bar{Q}$ output terminal 20 and a positive-going pulse at the normally low Q output terminal 18. Second multivibrator 26 is adapted to be triggered by the negative-going trailing edge of the Q output pulse from first multivibrator 14 and produces a negative-going pulse at its normally high $\bar{Q}$ output terminal 32 upon completion of the quasi-stable state of the first monostable multivibrator 14.

Each inverting amplifier 38, 46 operates functionally as a logic inverter, That is to say, it changes a high-level signal present at its input terminal to a low-level signal present at its input terminal to a low-level signal at its output terminal, and conversely, changes a low-level signal at its input terminal to a high-level signal at its output terminal.

The negative-going pulse from the $\bar{Q}$ output of multivibrator 14 passes through the first inverting amplifier 38 causing a positive-going pulse at the amplifier output which is applied to the first AND-driver input terminal 36. Since both AND-driver terminals are now high because a positive (high) voltage is continuously present at the second input terminal 40, the output voltage from the first AND-driver 34 becomes high for the duration of the $\bar{Q}$ output pulse from the first multivibrator 14. The positive-going pulse from inverting amplifier 38 is also applied through current limiting resistors R1 -R7 to the bases of output-driving transistors Q1-Q7, providing them with a saturation bias voltage.

Since the second multivibrator 26 is not triggered until the end of the first multivibrators's quasi-stable state, its $\bar{Q}$ output terminal 32 remains in its normally high state and causes a low-voltage signal at the output of the second inverting amplifier 46. This low-voltage signal is applied through current-limiting resistor 44 to the base of the first output-driving transistor 42, causing it to be biased to a cutoff condition, and to the second input of AND-driver devices 51-57, ensuring that the outputs of these AND-driver device are at a low voltage.

At this time (i.e. when the first multivibrator 14 is in the quasi-stable state), the first AND-driver device 34 is applying an actuating voltage to the reset terminal R of each relay 101-107 and output-driving transistors Q1-Q7 are providing a sustaining current for each relay 101-107, respectively. Current flows (in the direction of arrow 110) from the first AND-driver device output terminal 48 through the relay coils, and through the collector-emitter of the associated output-driving transistor Q1-Q7 to ground, thereby energizing each relay coil in a first direction.

When first multivibrator 14 returns to its stable state ($\bar{Q}$ output terminal 20 goes to a high voltage), the output of the first inverting amplifier 38 goes to a low voltage, causing the output of AND-driver 34 to be low voltage and driving transistors Q1-Q7 to be biased to cutoff condition. At this time all the relays have been latched in a first position and the relay coil current in direction 110 terminates.

A negative-going pulse from the $\bar{Q}$ output of second monostable multivibrator 26 (second multivibrator 26 having been triggered by the trailing edge of the Q output of first multivibrator 14) passes through the second inverting amplifier 46 causing a positive-going pulse at the amplifier output. This high-voltage signal is applied to the second input of the second input of the AND-driver devices 51-57 and through current limiting resistor 44 to the base of the first output-driving transistor 42, providing it with a saturation bias voltage.

The first input to each of the AND-driver devices 51-57 receives either a high-voltage signal or a low-voltage signal on lines 61-67, respectively, depending on the data from relay state-selector means 60. If an AND-driver device 51-57 is receiving a high signal on its first input at this time from relay state-selector means 60, both AND terminals will be high during the quasi-stable state of second multivibrator 26 causing the output voltage from that AND-driver 51-57 to be high.

This high output voltage provides an actuating voltage to the set terminal S of the associated relay 101-107 and the first output-driving transistor 42 provides a sustaining current for each relay so actuated. Current flows (in the direction of arrow 111) from the respective AND-driver device output through the relay coils, and through the collector-emitter of transistor 42 to ground, thereby energizing the selected relay coils in a second direction.

When second monostable multivibrator 26 returns to its stable state (the $\bar{Q}$ output goes to a high voltage), the output of the second inverting amplifier 46 goes to a low voltage causing the output of each AND-driver device that is not already a low voltage to go to a low voltage and causing driving transistor 42 to be biased to a cutoff condition. At this time, all the relays have been latched in a position corresponding to the data from relay state-selector means 60 and the relay coil current in direction 111 terminates.

It should be noted that when compared to the level of the output signal $\overline{Q}$ of multivibrator 14 and 26, the signals at the output of the inverting amplifiers 38 and 46 are at the same level as that at the nomcomplementary output signals Q. Therefore the inverting amplifiers 38 and 46 could be omitted and connections made to their output terminals then would be connected to the non-complementary output signal terminals 18 and 30.

An application of the present invention is a programmer for attenuation control for use with Hewlett Packard Model 33300 and 33301 attenuators which will provide attenuation control from 0 to 81 db in one db steps. The attenuator sections of these particular attenuators are controlled by magnetic latching relays and have a 1-2-4-4 db per pad and 10-20-40-40 db per pad arrangement respectively. The attenuator relays are connected to the AND-driver devices 34, and the output-driving transistors 42, Q1–Q7 so that current in direction 110 will cause the attenuator magnetic latching relays to latch in a position that applies maximum signal attenuation and current in direction 111 removes the attenuation. Relays 101, 102, 103, and 104 correspond to the relays associated with the 1-2-4-4 db sections of the HP 33300 attenuator and relays 105, 106, 107, correspond to the relays associated with the 10-20-40 db sections of the HP 33301 attenuator.

Thumbwheel switches 72 and 74 through decoder 76 provide control signals to AND-driver devices 51–57 on lines 61–67 respectively. Decoder 76 is adapted to provide a low voltage to the first input of the AND-driver device 51–57 that is associated with the relay 101–107 that controls an attenuator section that is selected to be activated (signal attenuation in effect). A high voltage is provided when a particular attenuator section is selected to be inactivated.

Operation of the attenuation control is initiated by a control pulse applied at input terminal 10 which triggers monostable multivibrator 14 as previously described. The $\overline{Q}$ output of multivibrator 14 (a 50 millisecond pulse) as applied to first AND-driver device 34 and output-driving transistors Q1–Q7 via inverting amplifier 38 causes an actuating current to flow in relays 101–107 in direction 110 for 50 milliseconds. This current sets the signal attenuation to maximum attenuation of 81 db. The trailing edge of the Q output of multivibrator 26 as applied to first output-driving transistor 42 and AND-driver devices 51–57 via inverting amplifier 46 causes an actuating current to flow in direction 111 for 50 milliseconds in the coils of the relays whose associated AND-driver device 51–57 has a high voltage signal on its first input. This current removes signal attenuation according to the attenuation selected.

It can be seen that the programmer of the present invention results in efficient and rapid control of magnetic latching relays. It is suitable for use in manual or computer-controlled operations and has specific application to controlling programmable attenuators.

It should be understood that the specific integrated circuits and circuit parameters discussed herein are only illustrative and not intended to limit the invention. Obviously many modifications and variations of the present invention are possible in light of the foregoing teachings. It is therefore to be understood that within the scope of the appended claims the invention may be practiced otherwise than as specifically described.

What is claimed and desired to be secured by Letters Patent of the United States is:

1. A programmer for selectively controlling magnetic latching relays, which comprises:
    a first monostable multivibrator for receiving an activating signal;
    a second monostable multivibrator coupled to the output of said first monostable multivibrator;
    relay state-selector means for providing control signals to select the position of the relays;
    a first AND-driver device for generating an actuating voltage for each relay, said first AND-driver device having a first input coupled to a high-level signal, a second input coupled to the output of said first monostable multivibrator so that said first AND-driver device second input is energized with a high-level signal only during the occurrence of the quasi-stable state of said first monostable multivibrator, and an output coupled to the reset terminal of each relay coil;
    first output-driving means for providing a sustaining current for each relay, said first output-driving means having a control input coupled to the output of said second monostable multivibrator and having output terminals connected between the circuit ground and said reset terminal of each relay coil;
    a plurality of AND-driver devices for generating actuating voltages, one associated with each relay coil, each of said plurality of AND-driver devices having a frist input coupled to said relay state-selector means for receiving a control signal, a second input coupled to the output of said monostable multivibrator so that the second input of each of said plurality of AND-driver devices is energized with a high-level signal only during the occurrence of the quasi-stable state of said second monostable multivibrator, and an output coupled to the set terminal of the associated relay coil; and
    a plurality of output-driving means for providing sustaining currents, one associated with each relay coil, each of said plurality of output-driving means having a control input coupled to the output of said first monostable multivibrator and having output terminals connected between the circuit ground and the set terminal of the associated relay coil,
    said first AND-driver device producing an actuating voltage establishing current through said relay coils in a first direction only during the occurrence of the quasi-stable state of said first monostable multivibrator, said plurality of output-driving devices being in a conducting state for supplying a sustaining current through said relay coils in said first direction only during the occurrence of the quasi-stable state of said first multivibrator, said plurality of AND-driver devices producing an actuating voltage establishing current through said associated relay coils in a second direction only upon the joint occurrence of said control signals from said relay state-selector means and of the quasi-stable state of said second monostable multivibrator, said first output-driving means being in a conducting state and supplying a sustaining curtent in said second direction only during the occurrence of the quasi-stable state of said second monostable multivibrator.

2. A programmer for selectively controlling magnetic latching relays, which comprises:

a first monostable multivibrator for receiving an activating signal;

a second monostable multivibrator coupled to the output of said first monostable multivibrator;

relay state-selector means for providing control signals to select the position of the relays;

a first AND-driver device for generating an actuating voltage for each relay, said first AND-driver device, having a first input coupled to a high-level signal, a second input coupled to the output of said first monostable multivibrator so that said first AND-driver device second input is energized with a high-level signal only during the occurrence of the quasi-stable state of said first monostable multivibrator, and an output coupled to the reset terminal of each relay coil;

a first output-driving transistor having a base coupled to the output of said second monostable multivibrator, a collector coupled to the reset terminal of each relay coil, and an emitter coupled to the circuit ground;

a plurality of AND-driver devices for generating actuating voltages, one associated with each relay coil, each of said plurality of AND-driver devices having a first input coupled to said relay state selector means for receiving a control signal, a second input of second monostable multivibrator so that the second input of each of said plurality of AND-driver devices is energized with a high-level signal only during the occurrence of the quasi-stable state of said second monostable multivibrator, and an output coupled to the set terminal of the associated relay coil; and a plurality of output-driving transistors, one associated with each relay coil, each of said plurality of output-driving transistors having a base coupled to the output of said first monostable multivibrator, a collector coupled to the set terminal of the associated relay coil, and an emitter coupled to the circuit ground, said first AND-driver device producing an actuating voltage establishing current through said relay coils in a first direction only during the occurrence of the quasi-stable state of said first monostable multivibrator, said plurality of output-driving transistors being in a conducting state and supplying a sustaining current through said relay coils in said first direction only during the occurrence of the quasi-stable state of said first multivibrator, said plurality of AND-driver devices producing an actuating voltage establishing current through said associated relay coils in a second direction only upon the joint occurrence of said control signal from said relay state-selector means and of the quasi-stable state of said second monostable multivibrator, said first output-driving transistor being in a conducting state and supplying a sustaining current in said second direction only during the occurrence of the quasi-stable state of said second monostable multivibrator.

3. A programmer as recited in claim 2 further comprising means for producing said activating signal.

* * * * *